United States Patent [19]
Kondoh et al.

[11] Patent Number: 5,185,538
[45] Date of Patent: Feb. 9, 1993

[54] OUTPUT CIRCUIT FOR SEMICONDUCTOR INTEGRATED CIRCUITS HAVING CONTROLLABLE LOAD DRIVE CAPABILITY AND OPERATING METHOD THEREOF

[75] Inventors: Harufusa Kondoh; Shinichi Uramoto, both of Hyogo, Japan

[73] Assignee: Mitsubishi Denki Kabushiki Kaisha, Tokyo, Japan

[21] Appl. No.: 710,477

[22] Filed: Jun. 5, 1991

[30] Foreign Application Priority Data

Jun. 13, 1990 [JP] Japan .................. 2-154404

[51] Int. Cl.⁵ .................. H03K 3/01; H03K 5/12
[52] U.S. Cl. .................. 307/270; 307/263; 307/264; 307/356; 307/359; 307/493; 307/494
[58] Field of Search ........ 302/270, 264, 359, 493–494, 302/263, 355–356

[56] References Cited

U.S. PATENT DOCUMENTS

| | | | |
|---|---|---|---|
| 4,882,506 | 11/1989 | Johansson et al. | 307/494 |
| 5,027,004 | 6/1991 | Palara | 307/456 |
| 5,039,874 | 8/1991 | Anderson | 307/270 |
| 5,081,379 | 1/1992 | Korteling | 307/355 |

FOREIGN PATENT DOCUMENTS 62-220026  9/1987  Japan .
1-121779   5/1989  Japan .

OTHER PUBLICATIONS

IBM Tech. Disc. Bul. vol. 24 No. 7A Dec. 1981 "Programmable Bipolar Driver" Parry.
IEEE 1988 Custom Integrated Circuits Conference, Leung et al., "Controlled Slew Rate Output Buffer", pp. 5.5.1–5.5.4.

Primary Examiner—William L. Sikes
Assistant Examiner—M. R. Wambach
Attorney, Agent, or Firm—Lowe, Price, LeBlanc & Becker

[57] ABSTRACT

An output circuit is disclosed for a semiconductor integrated circuit, having a controllable load drive capability. In a training mode for setting a load drive capability, a comparator compares the output signal generated from a driver circuit with the externally designated reference voltage. The control circuit controls the load drive capability of the driver circuit in response to the result of the comparison. The load drive capability of driver circuit 2 is set to a desired value by repeating the processing for these comparison and control. Accordingly, by externally controlling the level of the reference voltage, an output buffer can be obtained which is capable of setting the load drive capability to any value.

13 Claims, 12 Drawing Sheets

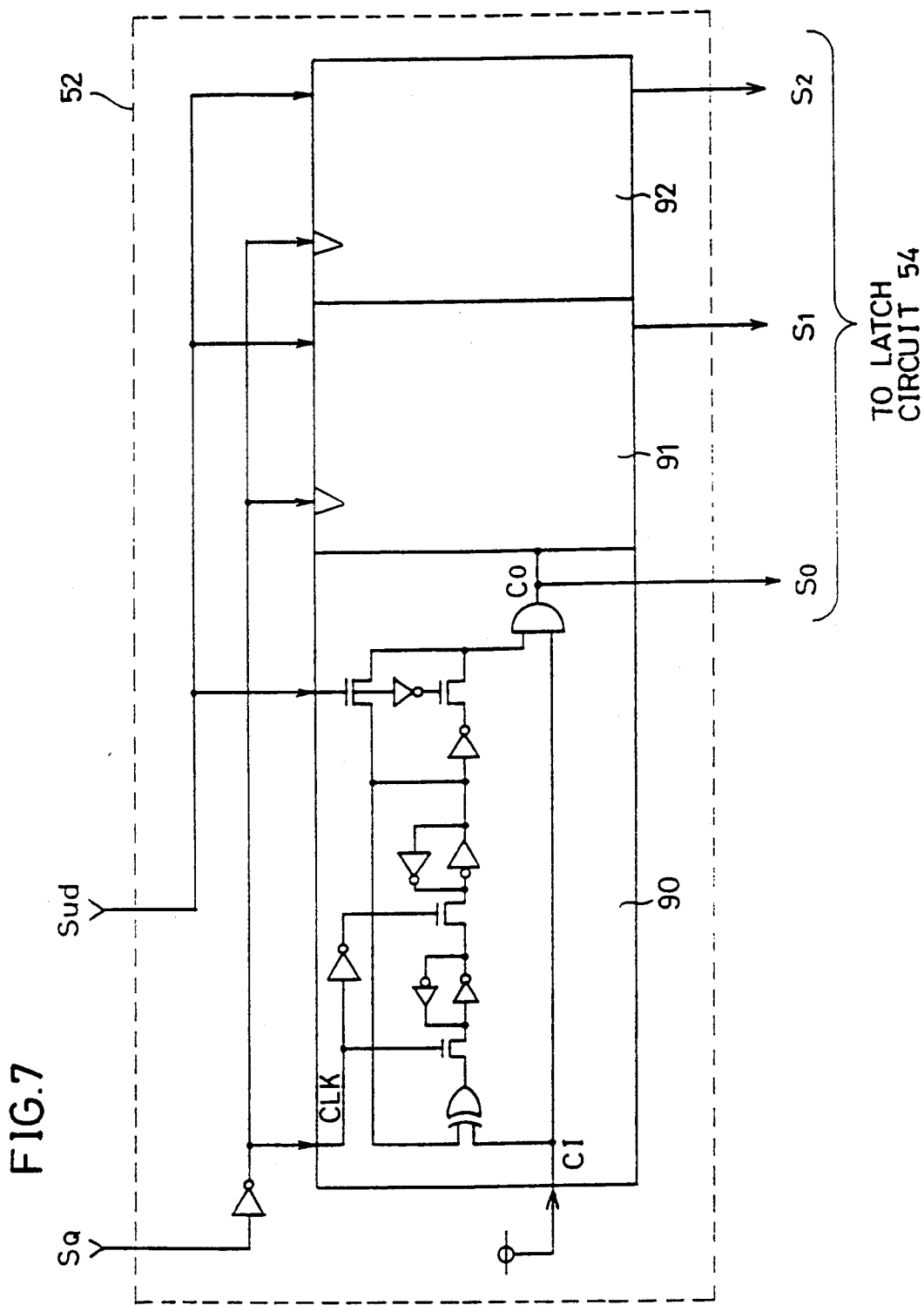

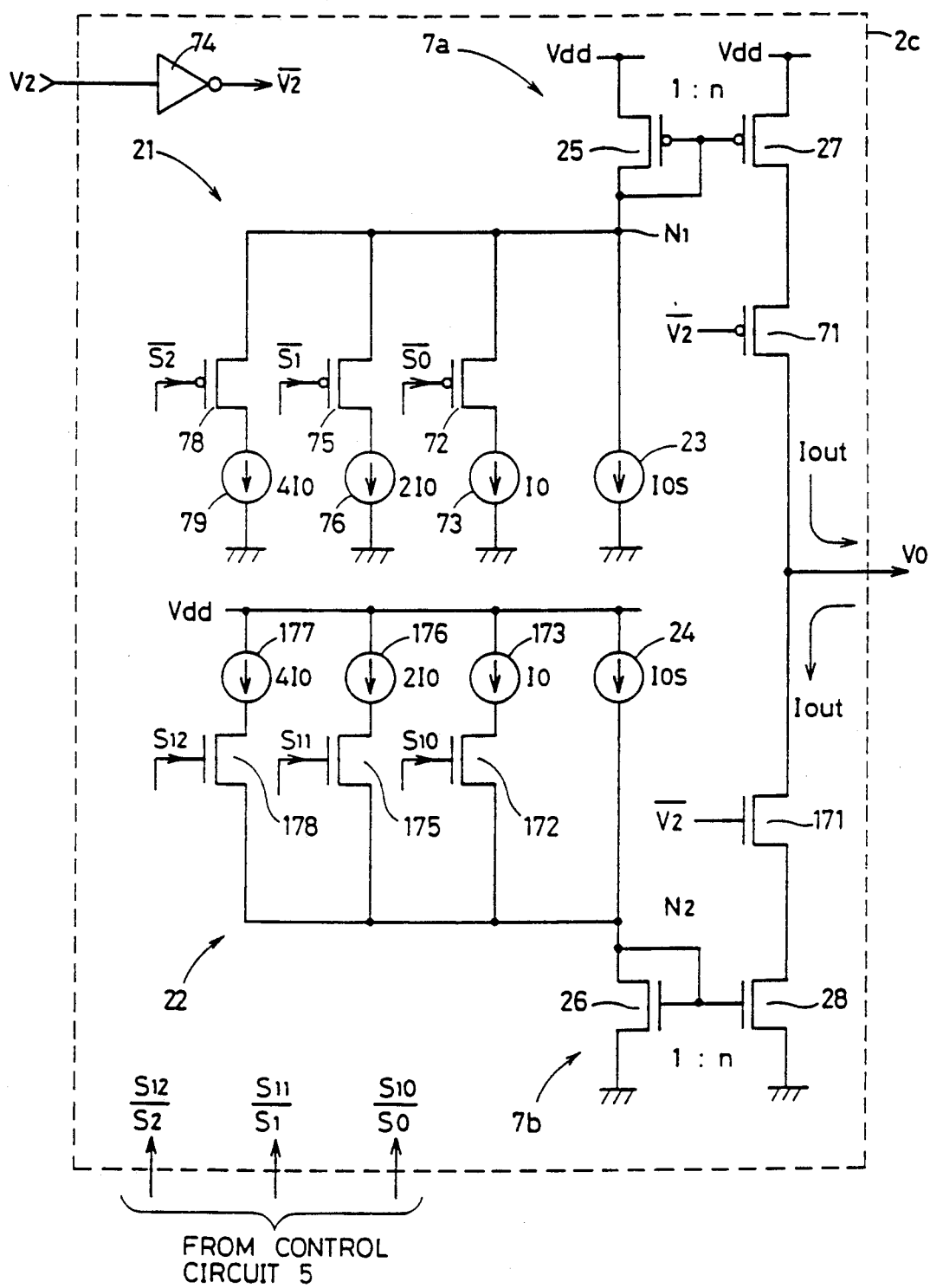

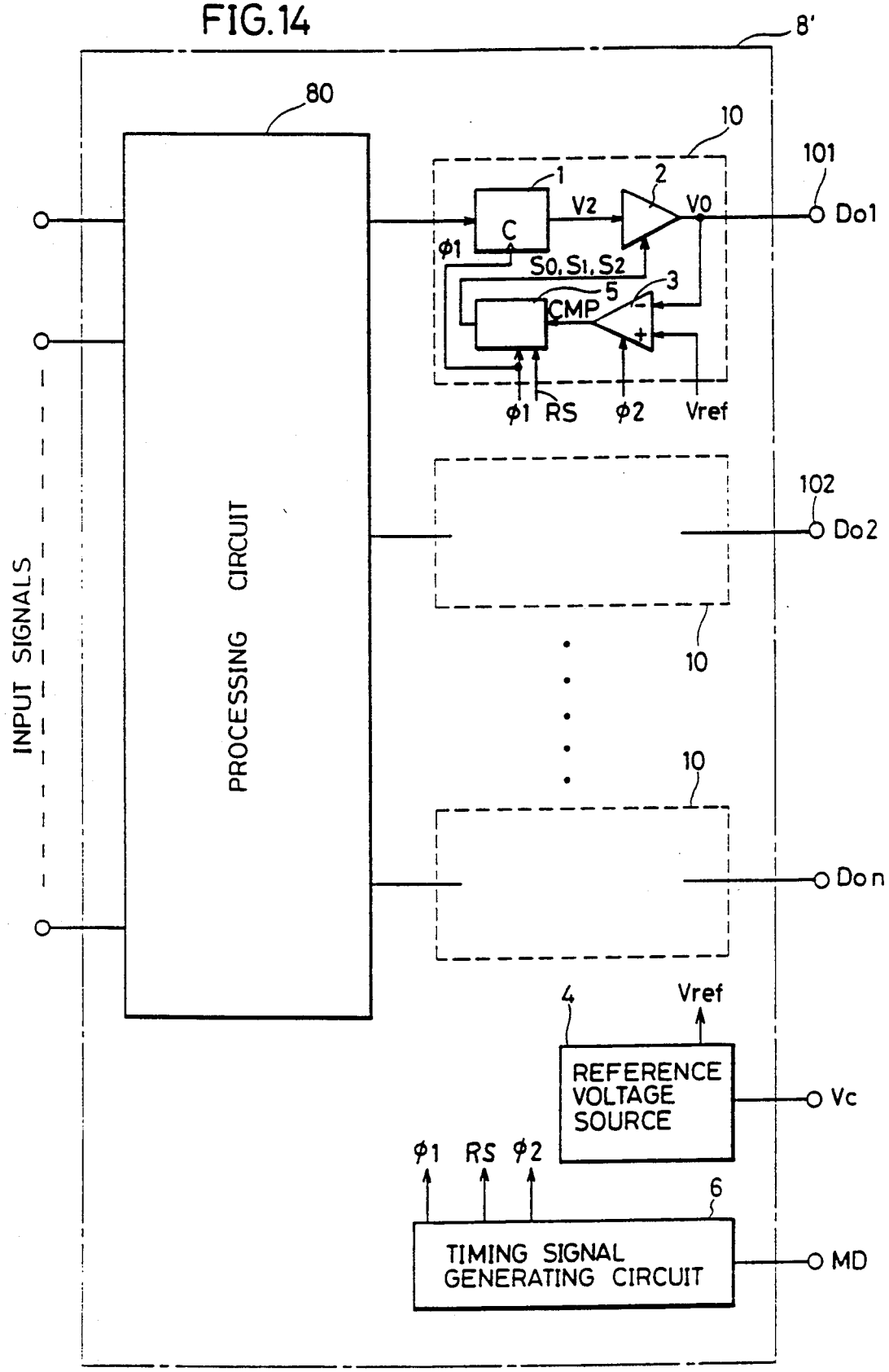

OUTPUT CIRCUIT FOR SEMICONDUCTOR INTEGRATED CIRCUITS HAVING CONTROLLABLE LOAD DRIVE CAPABILITY AND OPERATING METHOD THEREOF

BACKGROUND OF THE INVENTION

1. Field of the Invention

The present invention relates generally to output circuits for semiconductor integrated circuits, and more particularly, to output circuits having controllable load drive capability.

2. Description of the Background Art

Generally, various circuitry utilizing semiconductor devices comprises multiple semiconductor devices connected through interconnections. In other words, to implement a circuit function, multiple semiconductor devices are generally required. Accordingly, a number of semiconductor devices or elements are connected in parallel to an output terminal of a semiconductor device. The semiconductor device has an output buffer connected to its output terminal for driving these loads. The output buffer drives the load connected through the output terminal and an interconnection in response to the data signal to be output, generated within the semiconductor device. When the semiconductor device has a plurality of output terminals, each terminal is provided with an output buffer.

FIG. 11 shows a block diagram of conventional output buffer circuits 81 through 83 provided within the semiconductor device 8. Referring to FIG. 11, this semiconductor device 8 comprises a processing circuit 80 generating a data signal to be output in response to the input signal supplied through the input terminal, and output buffers 81 through 83 connected to receive the output data signal generated from the processing circuit 80. Each output buffer 81 through 83 drives the load connected to output terminals 101 through 103 respectively.

As previously described, the load is connected to each output terminal 101 through 103 of the semiconductor device 8 through an interconnecting line. An interconnection generally has a distributed parasitic capacitance with respect to ground. In addition to this, as a semiconductor device connected to an output terminal generally has an input capacitance, it is possible to equivalently express the load by way of capacitance including interconnection capacitance. Accordingly, as shown in FIG. 11, an equivalent lumped capacitance Cl through C3 is connected to each output terminal 101 through 103 through interconnections.

The conventional output buffers 81 through 83 have the same load drive capability. A load drive capability is defined as a current supply capability to a load. The values of each equivalent capacitance Cl through C3 connected to output terminals 101 through 103 are not necessarily the same because each output terminal 101 through 103 is connected to the different number of semiconductor devices through interconnections each having a different length. In the description below, it is assumed that the equivalent capacitances Cl through C3 satisfy the following relationship.

$$C1 < C2 < C3 \ldots (1)$$

FIG. 12 shows a waveform diagram illustrating the change of the output signals respectively output from each output buffers 81 through 83 shown in FIG. 11. As described above, as the loads connected to each output terminal 101 through 103, (i.e., the values of equivalent capacitance Cl through C3) are different from each other, the waveforms of the output signals S1 through S3 output through the corresponding terminal are different. That is, a time required for a rise (a rise time) and a time required for a fall (a fall time) of each output signal Sl through S3 differs respectively.

Since the equivalent capacitance Cl having the smallest value is connected to the output terminal 101, the output signal Sl rises and falls quickly. Conversely, as the equivalent capacitance C3 having the largest value is connected to output terminal 103, the output signal C3 rises and falls slowly. As the equivalent capacitance C2 having an intermediate value is connected to the output terminal 102, the output signal S2 rises and falls at a speed intermediate the rise and fall time of signals Sl and S3.

It is pointed out that while each output buffer 81 through 83 thus has the same load drive capability, the times required for the output signals Sl through S3 to change differ responsive to the values of loads connected to output terminals 101 through 103. That is, since the loads, i.e., the equivalent capacitances Cl through C3 of different value are connected to corresponding output terminal 101 through 103 respectively, the time required to charge and discharge these equivalent capacitances Cl through C3 differs. Thus, as shown in FIG. 12, the waveforms of the output signals Sl through S3 are different.

As a result, for example, the timing at which the level of signal S3 reaches a logical "H" level is delayed with respect to the timing at which the signal Sl represents a logical "H" (assuming that processing circuit 80 shown in FIG. 11 requires a logical "H" at the same timing). Namely, as shown in FIG. 12, the times $t_{H1}$, $t_{H2}$ and $t_{H3}$ at which respective output signals S1 through S3 represent a logical "H" are all different. Consequently, in the logic circuit connected to the output terminals 101 through 103, there is a possibility that an erroneous logical processing might be conducted over a period of time from time $t_{H1}$ to time $t_{H2}$ or to time $t_{H3}$. That is, a timing error is brought about.

In addition, it is also pointed out that it is necessary for the load drive capability of the output buffer to be set to an optimum value. That is, in the case in which too large a load drive capability is set so as to minimize the rise time and the fall time, output signal overshoot, undershoot and ringing are likely to occur. This means it is necessary to set a load drive capability to an optimum value, i.e., to control the load drive capability. Moreover, setting too large a load drive capability in the output buffer results in increasing electric power consumption. Accordingly, controlling the load drive capability also makes it possible to control power consumption, i.e., to decrease power consumption.

There is a gate array as one example of the semiconductor device shown in FIG. 11. In the gate array, the capacitance of an aluminum interconnection connected to the output circuit is modified in order to change the load drive capability of the output circuit. That is, the interconnection pattern for the aluminum interconnection of the gate array is modified. For this purpose, two, i.e., large and small interconnection patterns for controlling the load drive capability of the output circuit are prepared in advance and one of them is selected as needed. In the conventional gate array, however, it is noted that the problems above can occur since the load drive capability of the output circuit cannot be controlled in a flexible manner.

As another example, there is a semiconductor device connected to a bus line in a computer system. It is noted that there is a possibility that the above-described problems may occur because the semiconductor device provided in the computer system has a fixed load drive capability as shown in FIG. 11.

SUMMARY OF THE INVENTION

It is an object of the present invention to control a load drive capability of an output circuit for a semiconductor integrated circuit.

It is another object of the invention to set a load drive capability of an output circuit for a semiconductor integrated circuit to a desired value.

It is yet another object of the invention to set a load drive capability of an output circuit for a semiconductor integrated circuit to an optimum value.

It is still another object of the invention to control the time required for an output circuit of a semiconductor integrated circuit to cause an output signal to rise and fall.

It is yet another object of the invention to prevent a timing error from occurring in other logic circuit connected to an output circuit for a semiconductor integrated circuit.

It is still another object of the invention to prevent output signal overshoot, undershoot and ringing of an output signal output from a semiconductor integrated circuit output circuit.

It is yet another object of the invention to decrease power consumption of an output circuit for a semiconductor integrated circuit.

Briefly stated, the output circuit for the semiconductor integrated circuit according to the present invention comprises a drive circuit for driving a load connected to an output terminal in response to the data signal to be output, a detection circuit for detecting the drive capability of the drive circuit in response to the output signal from the drive circuit, a storage circuit for storing the signal detected by the detection circuit and a control circuit for controlling the drive capability of the drive circuit in response to the stored detection signal.

Prior to normal operation, the detection circuit detects the drive capability of the drive circuit and the detected signal is stored in the storage circuit. Since the drive capability of the drive circuit is controlled in response to the detected signal stored, an output circuit having a controllable load drive capability is obtained.

In another aspect, the output circuit for the semiconductor integrated circuit comprises a drive circuit for driving the load connected to the output terminal in response to the data signal to be output.

The operating method of the output circuit in accordance with the present invention comprises the steps of detecting the drive capability of the drive circuit in response to the output signal from the drive circuit, storing the drive capability signal detected, and controlling the drive capability of the drive circuit in response to the drive capability signal stored.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram of the up-down counter shown in FIG. 6.

FIG. 8C is a circuit diagram showing still another example of the driver circuit shown in FIG. 1.

FIG. 14 is a block diagram of a general semiconductor device to which the output buffer shown in FIG. 1 is applied.

DESCRIPTION OF THE PREFERRED EMBODIMENTS

Figure 1:
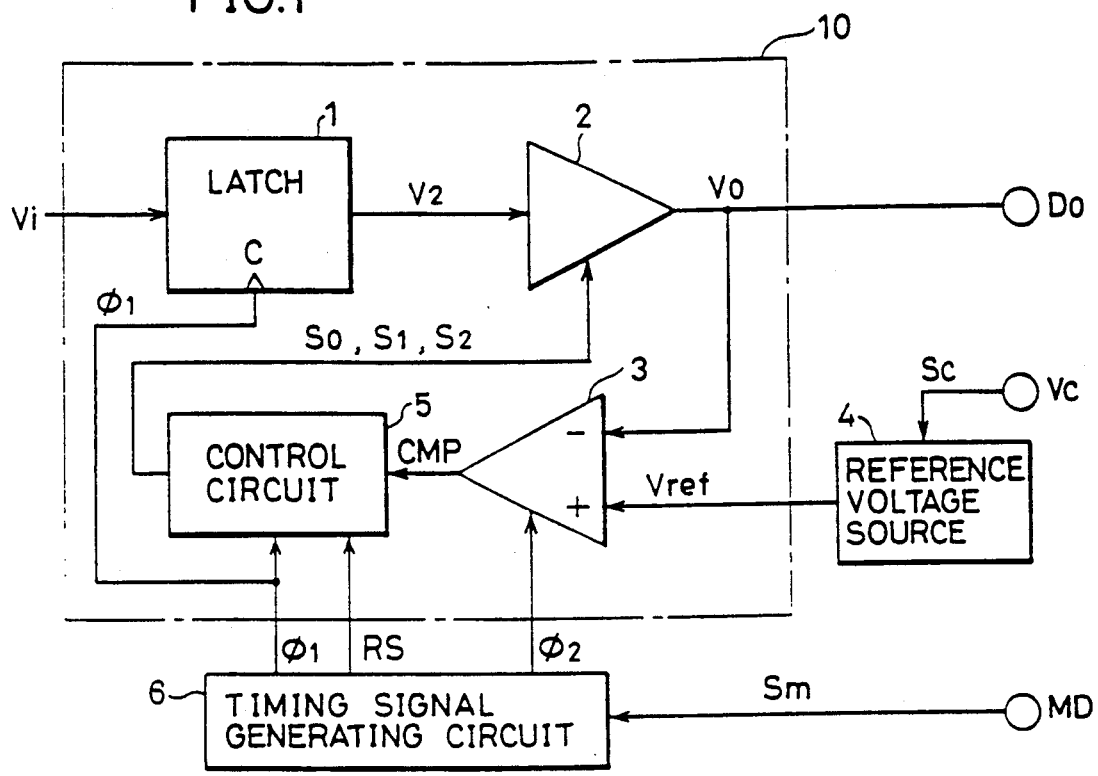
FIG. 1 is a circuit diagram of an output buffer showing one embodiment of the present invention.

In FIG. 1, an output buffer 10 is shown illustrating one embodiment of this invention. The output buffer 10 may be applied in place of each of the output buffers 81 through 83 within a semiconductor integrated circuit 8 shown in FIG. 11. Referring to FIG. 1, the output buffer 10 comprises a latch circuit 1 for receiving the data signal Vi to be output, a driver circuit 2 for receiving the signal V2 latched by the latch circuit 1, a comparator 3 for comparing the output signal $V_o$ generated from the driver circuit 2 with the reference voltage Vref generated from a reference voltage source 4, and a control circuit 5 for controlling the driver circuit 2 in response to the comparison signal CMP generated from the comparator 3. The signals $\phi 1$, $\phi 2$ and RS required to control the latch circuit 1, the comparator 3 and the control circuit 5 are generated from a timing signal generating circuit 6.

In operation, a signal Sm designating a load drive capability setting mode (a training mode) is applied through a mode terminal MD. The timing signal generating circuit 6 generates a reset signal RS, and clock signals $\phi 1$ and $\phi 2$ in response to this signal Sm. The reference voltage source 4 generates the reference voltage Vref in response to the control signal Sc applied through the voltage control terminal Vc. The timing signal generating circuit 6 repeatedly generates the clock signals $\phi 1$ and $\phi 2$ after supplying the reset signal RS to the control circuit 5 in response to the mode signal Sm.

Figure 2:
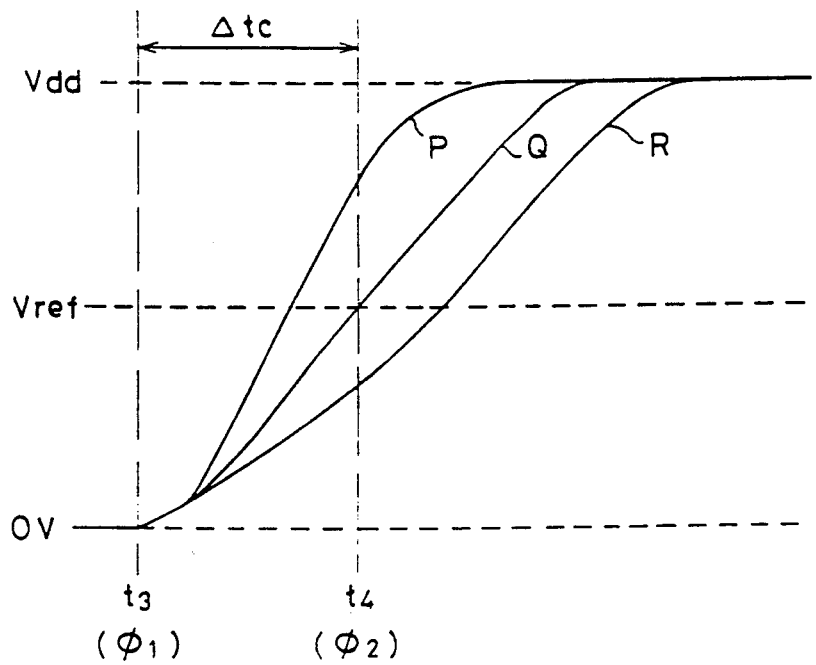
FIG. 2 is a signal waveform diagram for describing the operation of the circuit shown in FIG. 1.

Referring to FIG. 2, the timing signal generating circuit 6 generates the clock signals φ1 and φ2 respectively at time t3 and t4 having a predetermined time interval tc. A controllable level of the reference voltage Vref is shown in FIG. 2. The curves P, Q and R shown in FIG. 2 respectively represent a rising signal waveform of the output signal Vo when a different load drive capability is set.

Firstly, when the signal Sm is provided, the timing signal generating circuit 6 generates the reset signal RS. The counter provided within the control circuit 5 (not shown) is reset in response to the signal RS. The timing signal generating circuit 6 generates the clock signal φ1, and after time tc passes, generates the clock signal φ2. The latch circuit 1 latches the data signal Vi to be output in response to the signal φ1. The latched signal voltage V2 is supplied to the driver circuit 2. The driver circuit 2 generates the output signal Vo on the basis of the initial load drive capability. The output signal Vo is supplied to the comparator 3. The comparator 3 compares the output signal Vo with the reference voltage Vref generated from the reference voltage source 4. The comparator 3 generates the signal CMP representing the result of this comparison, and supplies the signal CMP to the control circuit 5. The control circuit 5 outputs signals S0, S1 and S2 for controlling the load drive capability of the driver circuit 2 in response to the signal CMP. The load drive capability of the driver circuit 2 is controlled in response to the signals S0, S1 and S2.

For example, when the driver circuit 2 outputs the signal Vo shown in the curve P shown in FIG. 2, the comparator 3 outputs a "0" signal CMP. The control circuit 5 decreases the load drive capability of the driver circuit 2 in response to this signal CMP. When the driver circuit 2 changes as shown by the curve R, the comparator 3 generates a "1" signal CMP. The control circuit 5 increases the load drive capability of the driver circuit 2 in response to the signal CMP. That is, the decision is made whether to increase or decrease the load drive capability of the driver circuit 2, in response to the result of the comparison of the output signal Vo obtained at the time when the clock signal φ2 is provided, with the reference voltage Vref.

When Vo >Vref (the curve P), the load drive capability of the driver circuit 2 is decreased. On the other hand, when Vo<Vref (the curve R), the load drive capability of the driver circuit 2 is increased. The driver circuit 2 is controlled to have the load drive capability as shown in the curve Q by repeatedly generating the clock signals φ1 and φ2, and as described above, repeatedly controlling the load drive capability of the driver circuit 2.

Figure 3:
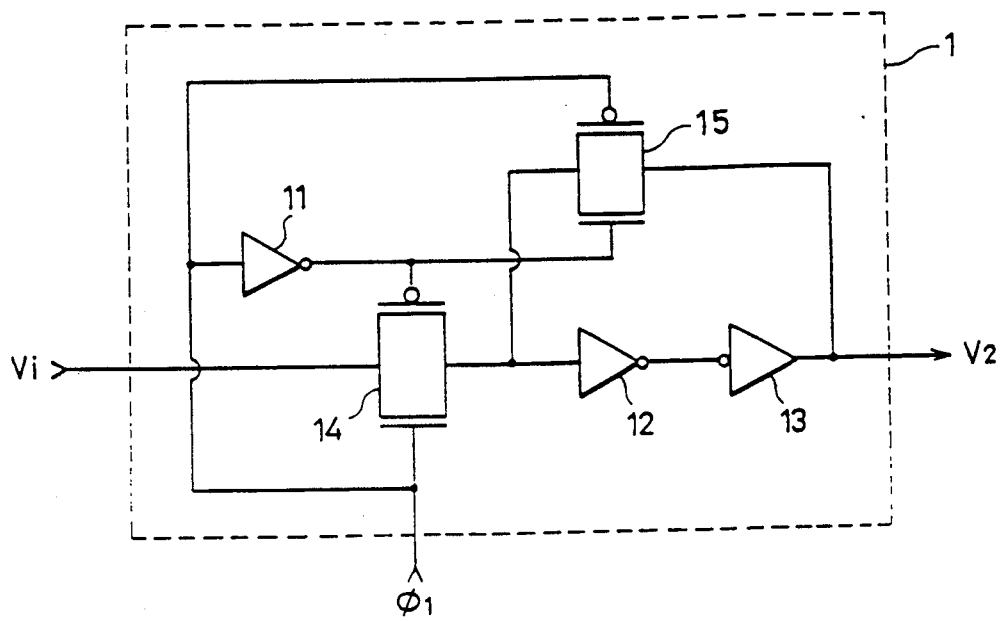
FIG. 3 is a circuit diagram of the latch circuit shown in FIG. 1.

In FIG. 3 there is shown the latch circuit 1 shown in FIG. 1. Referring to FIG. 3, the latch circuit 1 comprises three inverters 11 through 13 and CMOS transmission gates 14 and 15. In operation, the transmission gate 14 supplies the input signal Vi to the inverter 12 in response to the high level signal φ1. After the signal φ1 rises, the transmission gate 15 turns on, so that a flip-flop is formed by the two inverters 12 and 13. The input signal Vi is held by this flip-flop, and a held signal V2 is output.

Figure 4:
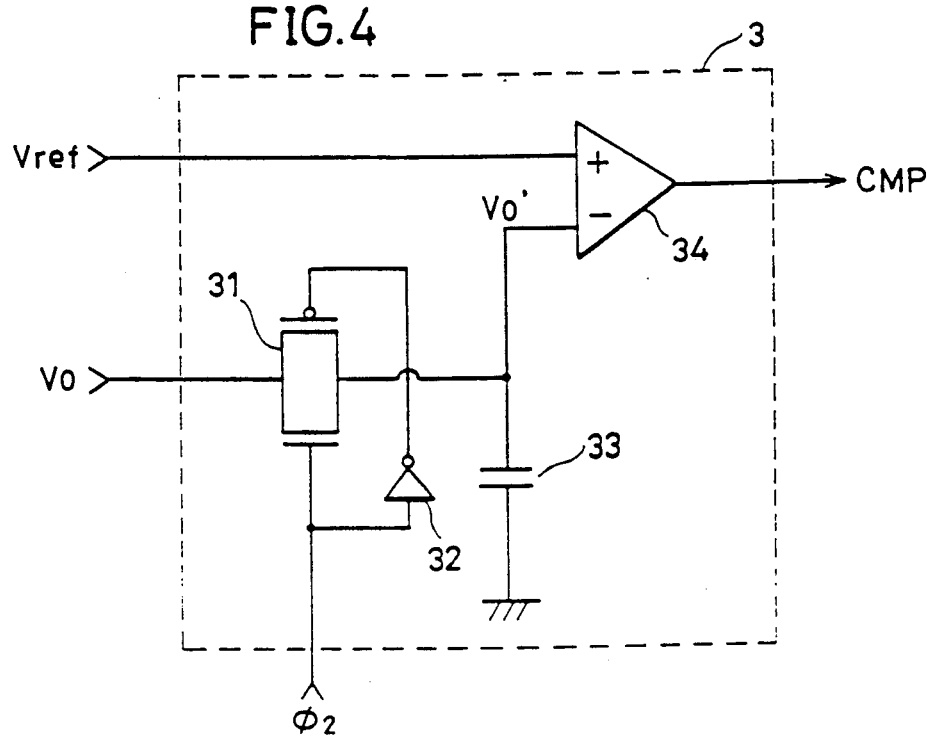
FIG. 4 is a circuit diagram of the comparator shown in FIG. 1.

Referring to FIG. 4, there is shown the comparator 3 shown in FIG. 1. The comparator 3 comprises a CMOS transmission gate 31 which operates in response to the clock signal φ2, an inverter 32, a capacitor 33 which holds the signal Vo, and a differential amplifier 34 which operates in response to the held signal voltage Vo' and the reference voltage Vref. In operation, when the high level signal φ2 is provided, the transmission gate 31 turns on, so that the input signal Vo is held by the capacitor 33. The differential amplifier 34 compares the held signal voltage Vo' with the reference voltage Vref, and outputs the signal CMP representing the result of the comparison. When Vo'< Vref, the differential amplifier 34 outputs a "1" signal CMP. When Vo'>Vref, the differential amplifier 34 outputs a "0" signal CMP.

Figure 5:
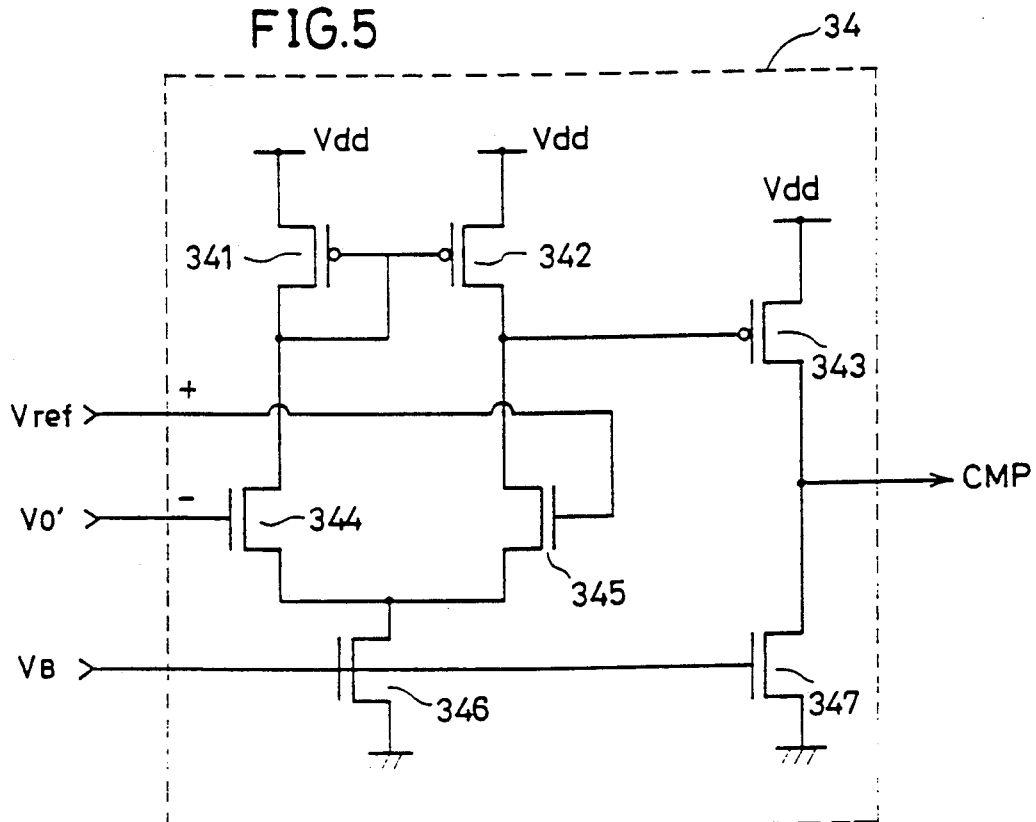
FIG. 5 is a circuit diagram of the differential amplifier shown in FIG. 4.

In FIG. 5 there is shown an example of the differential amplifier 34 shown in FIG. 4. Referring to FIG. 5, this differential amplifier 34 comprises PMOS transistors 341 through 343 and NMOS transistors 344 through 347. Each of transistors 346 and 347 has a gate connected to receive a bias voltage $V_B$. Therefore, each transistor 346 and 347 operates as a constant-current source.

Figure 6:
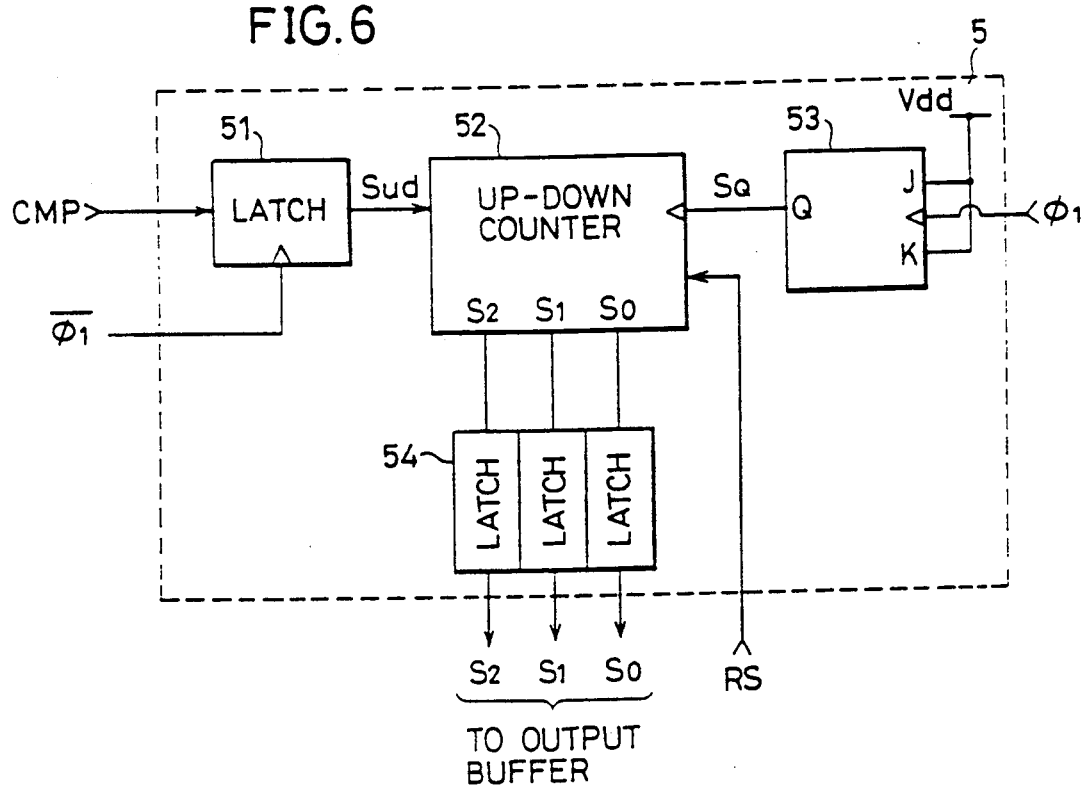
FIG. 6 is a block diagram of the control circuit shown in FIG. 1.

In FIG. 6 there is shown the control circuit 5 shown in FIG. 1. Referring to FIG. 6, this control circuit 5 comprises a latch circuit 51 for holding the signal CMP output from the comparator 3, an up-down counter 52 which operates in response to the signal Sud output from the latch circuit 51, a frequency divider 53 which frequency-divides the clock signal φ1, and a 3-bit latch circuit 54 which holds the output signal from the up-down counter 52. In the following description, it is assumed that the load drive capability of the driver circuit 2 shown in FIG. 1 is controllable in 8 steps. Accordingly, the signals S0 through S2 for controlling the load drive capability of the driver circuit 2 are stored within the 3-bit latch circuit 54.

In operation, the latch circuit 51 holds the signal CMP in response to the fall of the signal φ1, and supplies the held signal Sud to the up-down counter 52. The frequency divider 53 frequency-divides the clock signal φ1, and supplies the frequency-divided signal $S_q$ to the updown counter 52. Hence, the up-down counter 52 is driven by the clock signal $S_Q$. Accordingly, the up-down counter 52 increases or decreases its count value in response to the signal Sud from the latch circuit 51. That is, when the "1" signal CMP is supplied, counter 52 counts up the count value. Conversely, when the "0" signal CMP is supplied, the counter 52 counts down its count value. The value counted by the counter 52 is held by the latch circuit 54, and the held signals S0 through S2 are supplied to the driver circuit 2 shown in FIG. 1.

In FIG. 7 there is shown the up-down counter 52 shown in FIG. 6. Referring to FIG. 7, this up-down counter 52 comprises 1-bit counter elements 90 through 92, each having the same circuit structure. In operation, each counter element 90 through 92 is driven by the supplied clock signal $S_Q$. Each counter element 90 through 92 increases and decreases the count value in response to the count signal Sud which is respectively applied thereto. A carry signal Co is supplied from a low order counter element to a high order counter element. The signals S0 through S2 counted by counter elements 90 through 92 are supplied to latch circuit 54 shown in FIG. 6.

Figure 8A:
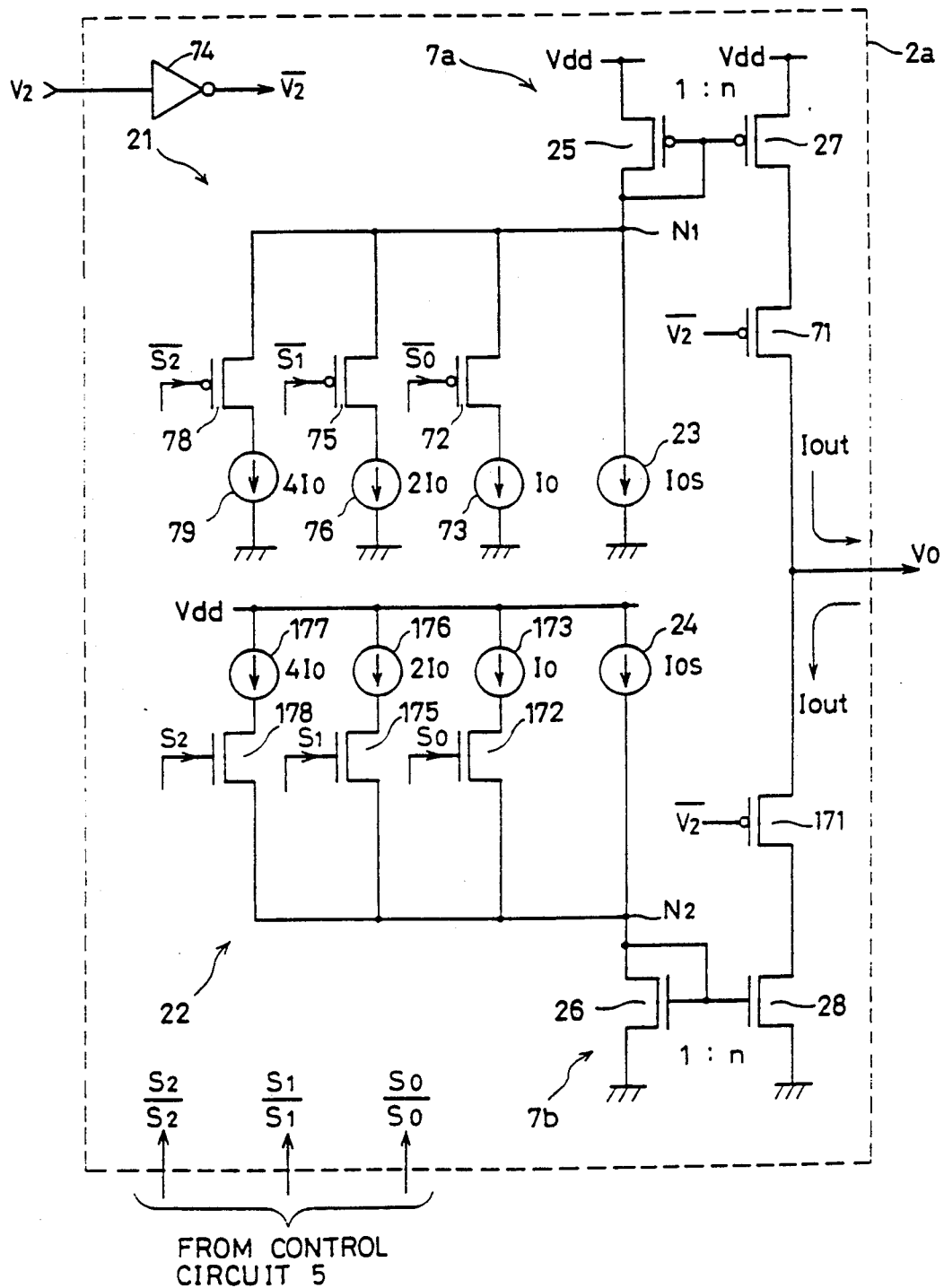
FIG. 8A is a circuit diagram of the driver circuit shown in FIG. 1.

In FIG. 8A there is shown the driver circuit 2 shown in FIG. 1. Referring to FIG. 8A, the driver circuit 2a comprises a first current mirror circuit 7a formed by PMOS transistors 25 and 27, a second current mirror circuit 7b formed by NMOS transistors 26 and 28, and current setting portions 21 and 22 which set a current flowing on a primary side of current mirror circuits 7a and 7b respectively. The transistor size ratio between transistors 25 and 27 is set to 1:n. Similarly, the transistor size ratio between the transistors 26 and 28 is set to 1:n. Inverter 74 is connected to receive the output signal V2 generated from latch circuit 1 shown in FIG. 1. PMOS and NMOS transistors have gates connected to receive the inverted signal $\overline{V2}$.

Current setting portion 21 for the first current mirror circuit comprises four constant-current sources 23, 73, 76 and 79, each of which supplies current of a predetermined value. Constant-current source 23 provides an offset current Ios for the first current mirror circuit. Each of constant-current sources 73, 76 and 79 generates a constant current having a value Io, 2Io, 4Io respectively. PMOS transistor 72 and constant-current source 73 are connected in series between the input node N1 of the first current mirror circuit 7a and ground. Similarly, PMOS transistor 75 and constant-current source 76 are connected in series. Moreover, PMOS transistor 78 and constant-current source 79 are connected in series.

Transistor 72 has a gate connected to receive the signal $\overline{S0}$ generated from control circuit 5. Similarly, transistor 75 has a gate connected to receive the signal $\overline{S1}$. Moreover, transistor 78 has a gate connected to receive the signal $\overline{S2}$.

Current setting portion 22 for the second current mirror circuit 7b has a similar circuit structure to that of current setting portion 21. Constant-current sources 24, 173, 176 and 177, and NMOS transistors 172, 175 and 178 are connected between input node N2 of the second current mirror circuit 7b and the power supply Vdd. Transistors 172, 175 and 178 have gates connected to receive the signal S0, S1 and S2 respectively. Accordingly, transistors 72 and 172, in response to the signals $\overline{S0}$ and S0 respectively, turn on, simultaneously. Similarly, transistors 75 and 175, in response to the signals $\overline{S1}$ and S1, turn on, synchronizing with each other. Transistors 78 and 178 also, in response to the signals $\overline{S2}$ and S2, turn on, synchronizing with each other. As a result, on the basis of the signals S0 through S2 generated from control circuit 5, a current shown in the following Table 1 is set in current setting portions 21 and 22:

TABLE 1

| S1 | S2 | S3 | Iout |
|---|---|---|---|
| 0 | 0 | 0 | (Ios          ) × n |
| 0 | 0 | 1 | (Ios + Io) × n |
| 0 | 1 | 0 | (Ios + 2Io) × n |
| 0 | 1 | 1 | (Ios + 3Io) × n |
| 1 | 0 | 0 | (Ios + 4Io) × n |
| 1 | 0 | 1 | (Ios + 5Io) × n |
| 1 | 1 | 0 | (Ios + 6Io) × n |
| 1 | 1 | 1 | (Ios + 7Io) × n | wherein Iout represents the current supplied from driver circuit 2 to the load. Also, the value "0" represents a low-level signal, and the value "1" a high-level signal.

In operation, transistors 72, 75, 78, 172, 175 and 178 turn on or off in response to the signals S0 through S2 generated from control circuit 5. As a result, a value of the current is determined which should flow on each input side of the first and the second current mirror circuits 7a and 7b. Accordingly, in accordance with Table 1, a drive current Iout is determined which flows in transistors 27 and 28 respectively. Transistors 71, 74, 77, 171, 174 and 179 operate in response to the signal V2 generated from latch circuit 1. Therefore, it is understood that this driver circuit 2a has the load drive capability set by the signals S0 through S2.

As stated above, an example of the circuit has been described which constitutes output buffer 10 shown in FIG. 1. With reference to the timing chart shown in FIG. 9 and the flow chart shown in FIG. 10, the operation of output buffer 10 shown in FIG. 1 will now be described.

Figure 11:
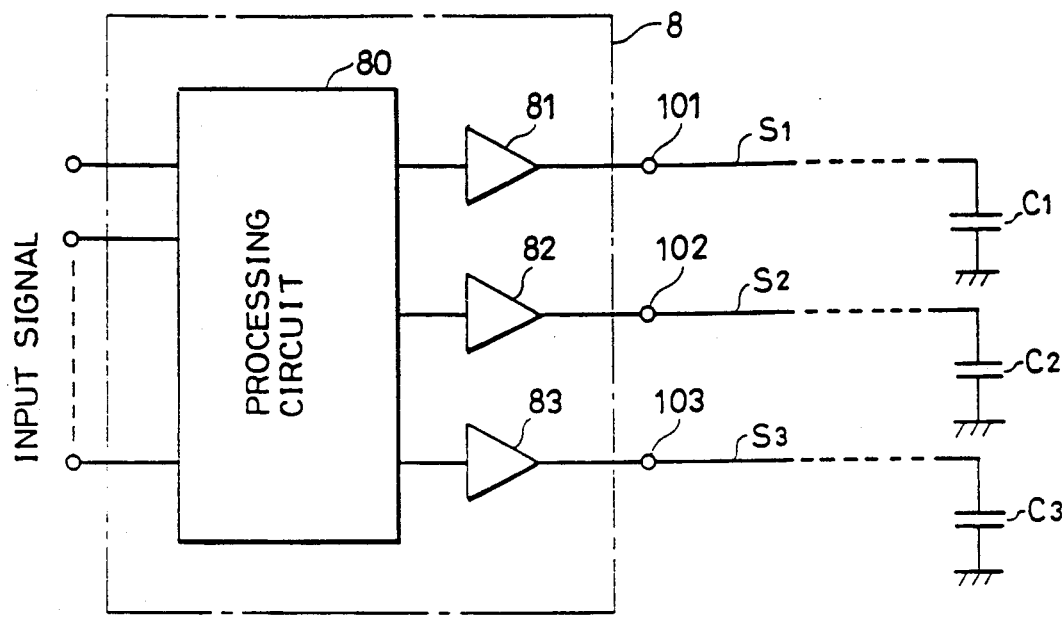
FIG. 11 is a block diagram showing an example of the connection of a conventional output buffer.

In the step 81, the mode designating signal Sm is supplied, and a training mode for setting the load drive capability is designated. Timing signal generating circuit 6 shown in FIG. 1 supplies the reset signal RS to control circuit 5 in response to the signal Sm. Up-down counter 52 shown in FIG. 6 is reset in response to the reset signal RS (step 82). Then, in the step 83, processing circuit 80 shown in FIG. 11 is set so that the data signal Vi to be output should be "1". Output buffer 10 shown in FIG. 1, thereby, receives the high level signal Vi, and generates the output signal Vo representing a rise.

Figure 9:
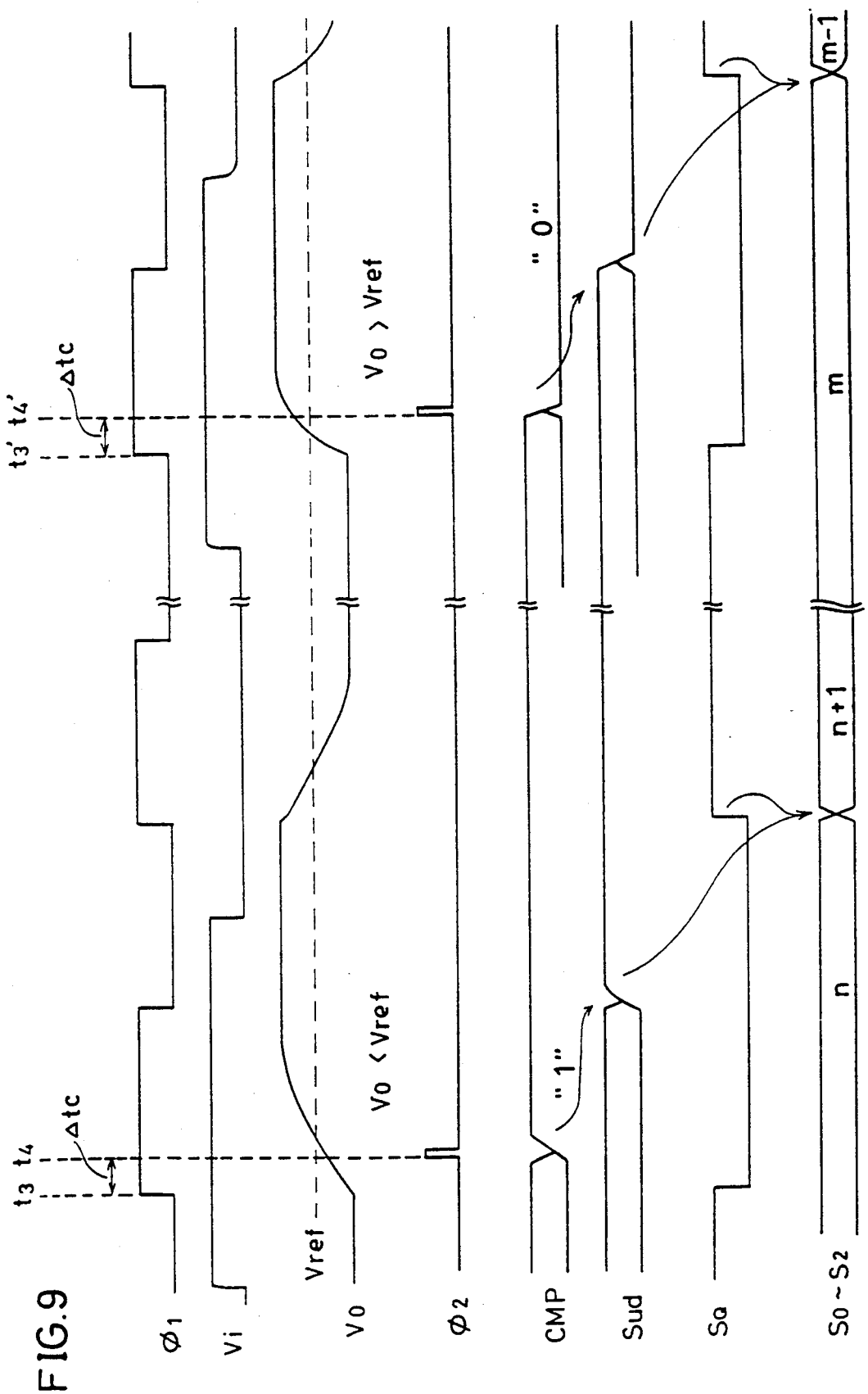
FIG. 9 is a timing chart for describing the operation of the output buffer shown in FIG. 1.
Figure 10:
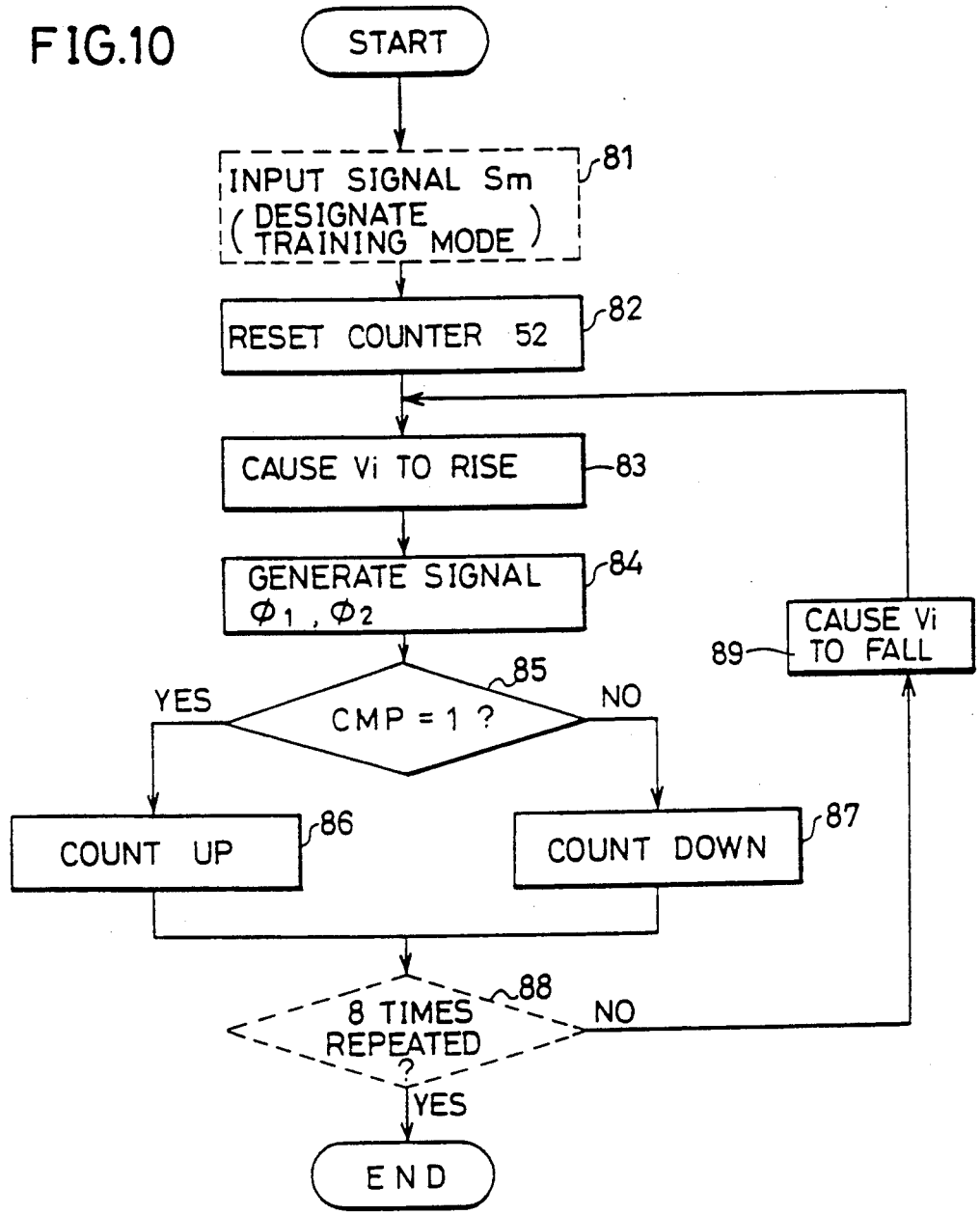
FIG. 10 is a flow chart for setting the load drive capability of the output buffer shown in FIG. 1.

In the step 84, timing signal generating circuit 6 generates the clock signals $\phi1$ and $\phi2$ at the timing shown in FIG. 9. That is, when time tc has passed after the clock signal $\phi1$ rised, the clock signal $\phi2$ rises. The output signal Vo obtained at the time when the signal $\phi2$ rises and the reference voltage Vref are compared with each other. On the basis of the result of this comparison, comparator 3 outputs the signal CMP (step 85). When the signal CMP is "1", the high level signal Sud which instructs the count-up is supplied to up-down counter 52 shown in FIG. 6. When the signal CMP is "0", the low level signal Sud which instructs the count-down is supplied to up-down counter 52 (step 87).

Up-down counter 52 shown in FIG. 6 increases the count value defined by the signals S0 through S2 from n to n+1 in response to the high level signal Sud. Up-down counter 52 decreases the count value defined by the signals S0 through S2 from m to m−1 in response to the low level signal Sud.

In the step 88, a decision is made whether the processing of the aforementioned steps 84, 85 and 86 or 87 have been repeated the given number of times, i.e., in this case 8 times. The processing of steps 84, 85 and 86 or 87 are repeated until this processing have been repeated 8 times (step 88). After repeating 8 times, the training mode for setting this load drive capability is finished.

Figure 13:
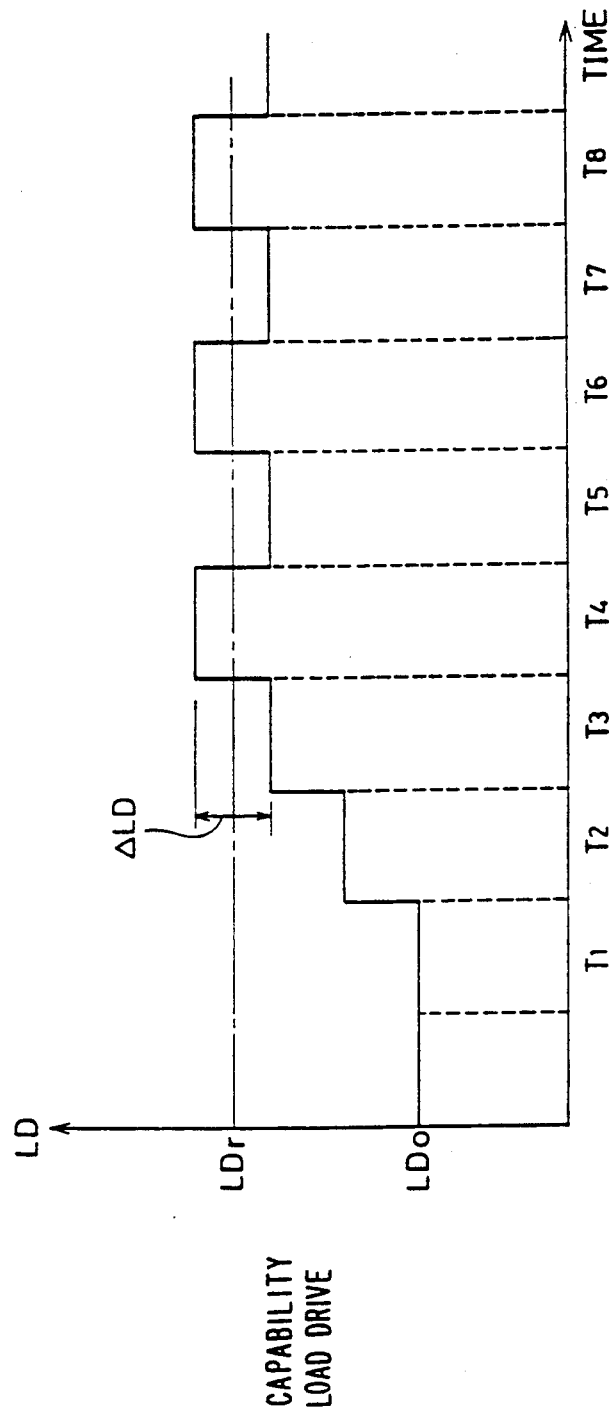
FIG. 13 is a diagram of the passage of time showing the change of the load drive capability in a training mode operation.

Accordingly, the load drive capability LD is changed, for example, as shown in FIG. 13. Referring to FIG. 13, the axis of ordinate indicates the load drive capability LD and the transverse axis indicates the passage of time. $LD_o$ indicates the initial load drive capability and $LD_4$ indicates the required load drive capability. $\Delta LD$ indicates an allowable range of the load drive capability. The processes of the above-mentioned steps 84, 85 and 86 or 87 are performed for each time period T1 to T8, so that the load drive capability LD is set within the designed range $\Delta LD$, near the required value $LD_r$ in the end.

In the example shown in FIG. 8A, the load drive capability in the falling of the output signal $V_o$ is set according to the setting of the load drive capability in the rising of the output signal $V_o$. That is, while the load drive capability in the falling is determined by the signals S0, S1 and S2, and the load drive capability in the rising is determined by the inverted signal $\overline{S0}$, $\overline{S1}$ and $\overline{S2}$.

Figure 8B:
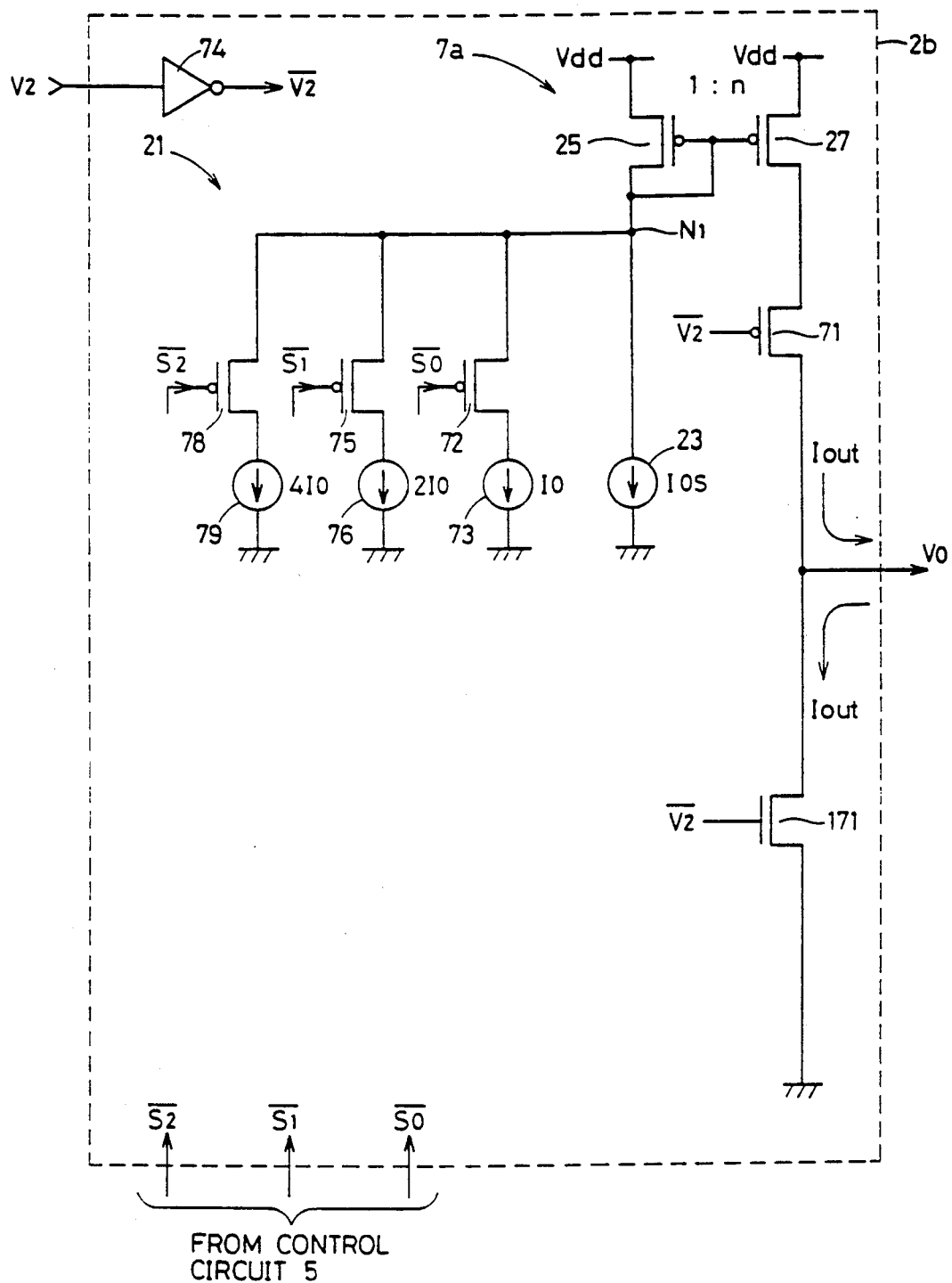
FIG. 8B is a circuit diagram showing another example of the driver circuit shown in FIG. 1.

If a circuit in the succeeding stage which operates in response to only the rising edge of the output signal is connected to the output buffer 10 shown in FIG. 1, the circuit for controlling or setting the load drive capability in the falling can be omitted as shown in FIG. 8B. The saturation current $I_{DS}$ of the transistor shown in FIG. 8B is represented as in the following equation and the fall time of the output signal $V_o$ is determined by $D_{DS}$.

$$I_{DS} = \mu \cdot C_{OX} \cdot W/L \cdot (V_{DD} - V_{th})^2 \ldots (1)$$

where $\mu$ is a mobility of electrons, $C_{OX}$ is a gate capacitance, $V_{DD}$ is a power supply voltage, and $V_{th}$ is a threshold voltage.

Furthermore, when it is required to set different load drive capabilities in rising and falling, the circuit shown in FIG. 8C is employed. Referring to FIG. 8C, the load drive capability in the rising is set by the signals $\overline{S0}$, $\overline{S1}$ and $\overline{S2}$ and the load drive capability in the falling is set by the signals S10, S11 and S12. The signals $\overline{S0}$, $\overline{S}$ and $\overline{S2}$ are generated from the control circuit 5 shown in FIG. 1 in accordance with the flowchart of FIG. 10 as stated above while the signals S10, Sll and S12 are generated from a similar control circuit 5' (not shown). In other words, the control circuit 5' is added for setting or controlling the load drive capability in the falling. The control circuit 5' basically operates in a similar way to that according to FIG. 10 in the training mode, it operates in a different way from FIG. 10 in the following two steps. That is, the signal S is caused to fall in the step 83 while the signal $S_i$ is caused to rise in the step 89. Accordingly, when the flow shown in FIG. 10 and a flow similar to it are executed, the signals $\overline{S0}$, $\overline{S1}$, $\overline{S2}$, S10, Sll and S12 are determined in the control circuit 5 and the similar control circuit 5' (not shown), so that the load drive capabilities in the rising and the falling are set independently.

In the embodiment above, the controllable load drive capability of driver circuit 2 shown in FIG. 1 can be controlled over the eight steps. If the number of these steps is increased as needed, it is possible to set the load drive capability of driver circuit 2 more precisely.

The reference voltage Vref generated from difference voltage source 4 can be externally controlled by the signal Sc. This means that it is possible to set the load drive capability of driver circuit 2 to be set, shown in FIG. 1, to any value by controlling the reference voltage level Vref.

FIG. 14 shows a general semiconductor device 8' to which the output buffer 10 shown in FIG. 1 is applied. The semiconductor device 8' includes one or a plurality of output buffers 10, a reference voltage source 4 and a timing signal generating circuit 6. It is noted that the output buffer 10 is applicable to a gate array and a semiconductor device connected to a bus line in a computer system.

Figure 12:
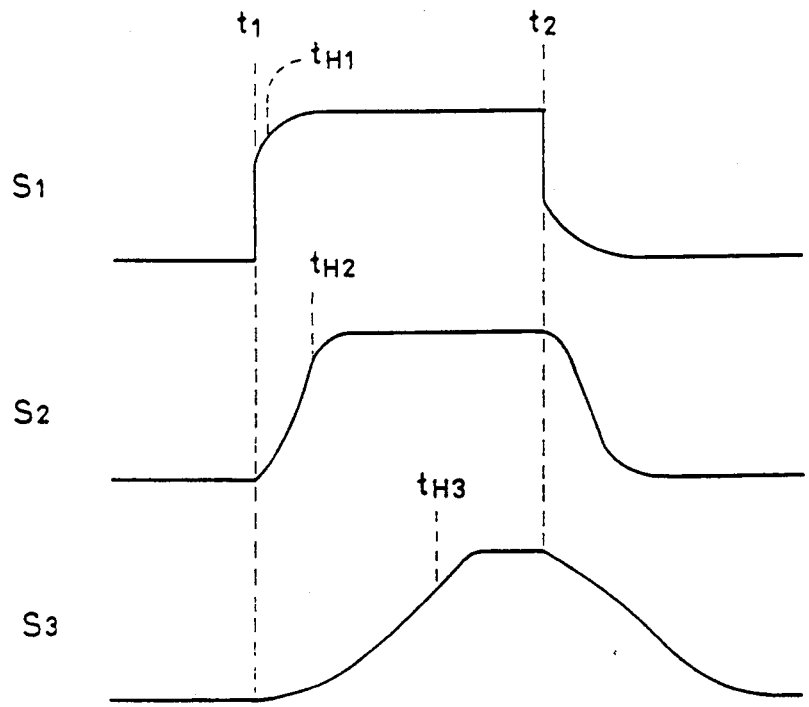
FIG. 12 is a waveform diagram of the signal output from the output buffer shown in FIG. 11.

As described above, it is pointed out that it is possible to control the timing at which the output signal Vo represents the logic "H" by applying output buffer 10 shown in FIGS. 1 to semiconductor integrated circuits. This prevents an occurrence of the timing error caused by the lag between time $t_{H1}$, $t_{H2}$ and $t_{H3}$ representing the logic "H" as shown in FIG. 12. In addition to this, the load drive capability can be set to an optimum value by controlling the reference voltage Vref generated from reference voltage source 4. This means that an occurrence of an overshoot, an undershoot and a ringing can be prevented. Moreover, it is also pointed out that output buffer 10 shown in FIG. 1 contributes to decrease electric power consumption as an optimum load drive capability can be set in response to the load.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output circuit for a semiconductor integrated circuit, having a controllable drive capability for driving a load connected to an output terminal of said output circuit, comprising:

input means for receiving a data signal to be output;

driving means responsive (i) to the received data signal for supplying an output data signal to the load and (ii) to a control signal for controlling a current of said output data signal;

detecting means responsive to the output data signal from said driving means for detecting a drive capability of said driving means and, in response, providing a drive detecting signal;

storage means for storing the drive detection signal; and control means for supplying said control signal in response to the drive detection signal stored in said storage means for controlling the current of said output data signal supplied by said driving means.

2. An output circuit for a semiconductor integrated circuit according to claim 1, wherein said detecting means comprises a reference voltage source for generating a controllable reference voltage, and comparing means for comparing the reference voltage with the output voltage of said driving means obtained at a predetermined time after said input means receives said data signal; and said control means controls the drive capability of said driving means in response to the output signal from said comparing means.

3. An output circuit for a semiconductor integrated circuit according to claim 1, wherein said control means comprises current control means responsive to said detecting means for controlling a current level supplied through the output terminal from said driving means to the load.

4. In an output circuit, for a semiconductor integrated circuit, having a controllable driving capability for driving a load connected through an output terminal, said output circuit including means for receiving a data signal to be output, and driving means responsive to the data signal received for driving the load connected to said output terminal, a method of operating said output circuit for driving said load comprising the steps of:

detecting a drive capability of said driving means in response to an output signal from said driving means and outputting a drive capability signal;

storing the drive capability signal; and controlling the drive capability of said driving means in response to the stored drive capability signal.

5. The method of operating said output circuit according to claim 4, wherein said step of detecting the drive capability of said driving means comprises comparing a predetermined reference voltage with the output voltage of said driving means obtained at the time when a predetermined time has passed after the reception by said receiving means, and said step of storing said drive capability signal detected comprises storing signal representing the result of said comparison.

6. An output circuit for semiconductor integrated circuit, comprising;
  output buffer means responsive to a data signal for supplying an output signal and responsive to an output drive control signal for controlling a current of said output signal;
  driving capability detecting means for detecting a level of a predetermined parameter of said output signal by comparing said output signal with a reference level; and
  drive control means for supplying said output drive control signal to said output buffer means.

7. An output circuit for a semiconductor integrated circuit, comprising:
  timing signal means for supplying first and second clock signals;
  gate means receiving a data signal and supplying a data signal in response to said first clock signal;
  output buffer means responsive to said data signal gated by said gate means for supplying an output signal and responsive to an output drive control signal for controlling a current of said output signal;
  driving capability detecting means responsive to said second clock signal for detecting a level of a predetermined parameter of said output signal by comparing said output signal with a reference signal; and
  drive control means responsive to the detected level of said predetermined parameter of said output signal for supplying said output drive control signal to said output buffer means.

8. The output circuit according to claim 7, wherein said output buffer means comprises:
  a plurality of current sources, outputs of which are individually selectable in response to said output drive control signal for supplying a combined reference current;
  switching means for supplying a control current data signal in response to said data signal; and
  current mirror means receiving said combined reference current for supplying said output signal in response to said control current data signal.

9. An output circuit for a semiconductor integrated circuit, having a controllable drive capability for driving a load connected to an output terminal of said output circuit, comprising:
  input means for receiving a data signal to be output;
  driving means responsive (i) to the received data signal for supplying an output data signal to the load and (ii) to a control signal for controlling a current of said output data signal;
  detecting means responsive to the output data signal from said driving means for detecting a drive capability of said driving means and, in response, providing a drive detecting signal;
  storing means for storing the drive detection signal;
  control means for supplying said control signal in response to the drive detection signal stored in said storage means for controlling the current of said output data signal supplied by said driving means; and
  timing signal generating means for generating a first and a second timing signal; wherein
  said detecting means comprises
    a reference voltage source for generating a controllable reference voltage, and
    comparing means for comparing the reference voltage with the output voltage of said driving means obtained at a predetermined time after said input means receives said data signal;
  said control means controls the drive capability of said driving means in response to the output signal from said comparing means;
  said second timing signal is generated when said predetermined time has passed after said first timing signal is generated;
  said input means receives the data signal to be output in response to the first timing signal; and
  said comparing means compares the reference voltage with the output voltage of said driving means in response to the second timing signal.

10. An output circuit for a semiconductor integrated circuit according to claim 9, wherein
  said timing signal generating means repeatedly generates a pair of said first and second timing signals,
  said control means further includes counting means for counting the output signal from said comparing means, and
  another storage means for storing the output signal from said counting means.

11. An output circuit for a semiconductor integrated circuit according to claim 10, wherein
  said another storage means comprises latch means which is connected to said counting means and latches the signal counted by said counting means.

12. An output circuit for a semiconductor integrated circuit, having a controllable drive capability for driving a load connected to an output terminal of said output circuit, comrpising:
  input means for receiving a data signal to be output;
  driving means responsive (i) to the received data signal for supplying an output data signal to the load and (ii) to a control signal for controlling a current of said output data signal;
  detecting means responsive to the output data signal from said driving means for detecting a drive capability of said dirving means and, in response, providing a drive detecting signal;
  storage means for storing the drive detection signal; and
  control means for supplying said control signal in response to the drive detection signal stored in said storage means for controlling the current of said output data signal supplied by said driving means; wherein
  said driving means comprising current mirror means which receives the control signal from said control means and generates the current to be supplied to the load through the output terminal.

13. An output circuit for a semiconductor integrated circuit, having a controllable drive capability for driving a load connected to an output terminal of said output circuit, comrpising:
  input means for receiving a data signal to be output;
  driving means responsive (i) to the received data signal for supplying an output data signal to the load and (ii) to a control signal for controlling a current of said output data signal;

detecting means responsive to the output data signal from said driving means for detecting a drive capability of said driving means and, in response, providing a drive detecting signal;

storage means for storing the drive detection signal; and control means for supplying said control signal in response to the drive detection signal stored in said storage means for controlling the current of said output data signal supplied by said driving means; wherein said control means comprises current generating means responsive to said detecting means for generating a current proportional to the current to be supplied to the load, and said driving means comprises current mirror means which receives the current generated from said current generating means and generates the current supplied to the load.

* * * * *